United States Patent [19]

Tsuo

[11] Patent Number: 5,041,361
[45] Date of Patent: Aug. 20, 1991

[54] OXYGEN ION-BEAM MICROLITHOGRAPHY

[75] Inventor: Y. Simon Tsuo, Lakewood, Colo.

[73] Assignee: Midwest Research Institute, Kansas City, Mo.

[21] Appl. No.: 457,852

[22] Filed: Dec. 27, 1989

Related U.S. Application Data

[63] Continuation-in-part of Ser. No. 229,298, Aug. 8, 1988, Pat. No. 4,960,675.

[51] Int. Cl.$^5$ .............................................. G03C 5/00
[52] U.S. Cl. .................................. 430/311; 430/322; 430/325; 156/628; 250/492.3; 250/492.2
[58] Field of Search ................... 250/492.21, 492.3; 156/628; 430/311, 322, 325

[56] References Cited

U.S. PATENT DOCUMENTS

| | | | |
|---|---|---|---|
| 4,377,437 | 3/1983 | Taylor et al. | 156/628 |
| 4,383,026 | 5/1983 | Hall | 430/325 |
| 4,569,124 | 2/1986 | Rensch et al. | 29/591 |
| 4,601,778 | 7/1986 | Robb | 156/628 |
| 4,615,904 | 10/1986 | Ehrlch et al. | 427/38 |

OTHER PUBLICATIONS

Focused Ion Beam Scans Small Structure, Test & Measurement World, p. 16 (1988).
Darryl W. Peters, Keeping America Competitive, Examining Competitive Submicron Lithography Semiconductor International, pp. 96–100 (1988).
Irwin Goodwin, Compact X-Ray Lithography Machines Generate Hope for Semiconductors, Physics Today, pp. 49–52 (1988).
Joseph Grenier, Wafer Fabrication Equipment Five Year Forecast, Solid State Technology, pp. 67–70 (1988).
William Thurber, Photolithography's Heir Still Not Obvious, Says Interface Keynote, Semiconductor International, p. 15 (1988).
T. D. Cambria and N. P. Economou, Mask and Circuit Repair with Focused-Ion Beams, Solid State Technology, pp. 133–136 (1987).

Primary Examiner—Charles L. Bowers, Jr.
Assistant Examiner—Ashley I. Pezzner
Attorney, Agent, or Firm—Ken Richardson

[57] ABSTRACT

A method of providing and developing a resist on a substrate for constructing integrated circuit (IC) chips includes the following steps: of depositing a thin film of amorphous silicon or hydrogenated amorphous silicon on the substrate and exposing portions of the amorphous silicon to low-energy oxygen ion beams to oxidize the amorphous silicon at those selected portions. The nonoxidized portions are then removed by etching with RF-excited hydrogen plasma. Components of the IC chip can then be constructed through the removed portions of the resist. The entire process can be performed in an in-line vacuum production system having several vacuum chambers. Nitrogen or carbon ion beams can also be used.

19 Claims, 2 Drawing Sheets

OXYGEN ION-BEAM MICROLITHOGRAPHY

CONTRACTUAL ORIGIN OF THE INVENTION

The U.S. Government has rights in this invention pursuant to Contract No. DE-AC02-83CH10093 between the U.S. Department of Energy and the Midwest Research Institute.

BACKGROUND OF THE INVENTION

1. Reference to Related Patent Application

This patent application is a continuation-in-part of co-pending U.S. patent application Ser. No. 07/229,298, filed Aug. 8, 1988, now U.S. Pat. No. 4,960,675 and titled Hydrogen Ion Microlithography.

2. Field of the Invention

The invention relates generally to semiconductor lithography and pertains, more specifically, to an oxygen ion microlithography process.

3. Description of the Prior Art

Recently, there has been rapid growth in the application and fabrication of microelectronics. Microelectronics fabrication generally concerns using conventional semiconductor lithography to produce various micrometer-sized discrete semiconductor devices, integrated circuits, and solid-state devices in a substrate. Generally, in semiconductor microlithography, a material called a resist is deposited on a semiconductor substrate. The resist is then developed to create a patterned network over the surface of the substrate corresponding to a pattern of electronic components or circuits desired on or in the substrate. Subsequent to resist development, these patterns facilitate selective deposition or incorporation of various selected materials onto or into the substrate to form the electronic components or circuits in the actual chip construction. The resist material coated onto the substrate should also protect the substrate from external contamination, and the resist material itself should not contribute contaminants to the substrate.

In conventional resist development, a high-resolution integrated circuit pattern is formed in the resist overlaying the semiconductor substrate, usually by selective exposure of the resist to some form of electromagnetic radiation or ion beam to change the chemical or physical characteristics of the selected exposed portions of the resist in relation to the nonexposed portions. Once the resist has been exposed and the desired pattern formed therein, the resist is further developed by selective removal of either the exposed or the unexposed portions to create openings through the resist all the way down to the semiconductor substrate. Then, permanent micrometer-sized device structures are formed in or on the substrate through the openings in the resist by additive deposition of desired component materials, such as, for example, dopants, metals, nonmetallic ohmic materials, or insulative materials, as needed.

The current focus in the industry is toward submicrominiaturization. Smaller is considered better. However, submicrominiaturization is not without its obstacles. For example, some older microlithography processes, such as photolithography, are not capable of producing the smaller linewidths in submicrometer dimensions and smaller geometries required for submicrominiaturization. In such conventional photolithography processes, the resist, which itself eventually becomes a mask to the semiconductor substrate, is a material that changes its characteristics when exposed to electromagnetic radiation of a certain wavelength, such as ultraviolet light. This resist material is first masked or overlaid with a mask material that contains a pattern that is open or transparent to certain wavelengths of electromagnetic radiation, such as, for example, the ultraviolet light, interspersed between a pattern that is opaque to, or blocks, such radiation or light. Ultraviolet light is then transmitted through the transparent portions of the mask to expose corresponding, unmasked portions of the resist, thereby causing alteration or changes of certain chemical and physical properties of the portions of the resist material that are exposed to the ultraviolet or other wavelength light.

Unfortunately, diffraction effects from the mask openings and reflection effects within the resist material in such photolithography processes frequently degrade the quality of the replicated mask image, thus limiting the precision and sharpness of the exposed patterned portions, which makes even smaller submicrominiaturization impractical or impossible. Such diffraction effects occur because the mask is separated from the resist during exposure to the ultraviolet light. These diffraction effects are particularly acute when the pattern linewidth is reduced to the extent that it is comparable to the wavelength of the ultraviolet light. Reducing the separation between the mask and the resist was tried to alleviate this diffraction problem. However, when the mask is placed relatively close to or directly on the resist, irregularities on the resist frequently develop at the mask surface. Such irregularities in the mask result in corresponding defects in the next resist exposed with that mask, thereby rendering the mask useless for repetitive development of more than one resist.

In attempting to cope with these problems of diffraction, the technique known as projection photolithography was developed. Projection photolithography normally uses the combination of a shorter radiation wavelength to expose the resist and a mask contained within an optical system, rather than on the surface of the resist, to focus and project the radiation in the desired pattern onto a resist. Such patterned optical systems can project and focus the desired pattern image either in real size or in reduced size onto the resist. The shorter radiation wavelengths beneficially reduce the diffraction effects; however, spherical aberration effects in the lenses of such optical systems place undesirable limits on the pattern resolutions attainable with this projection replication process.

Another problem associated with the photolithography process is that it requires a very flat, smooth, and uniform photoresist surface to minimize not only the diffraction problems described above, but also to minimize any problems associated with angles of incidence and parallax errors due to the spatial separation of the mask from the photoresist. Therefore, photoresists typically have to be painstakingly spun onto a very flat substrate.

In attempting to alleviate more of the aforesaid problems in photolithography, the microelectronic industry has also tried turning to high-energy (shorter wavelength) radiation exposure systems, which are systems with Xrays or particle beams having energies greater than 1000 eV. The conventional sources of such high-energy systems are electron beams (e-beams), ion beams, and Xrays, which use shorter wavelengths and higher energy photons. With such high-energy radiation sources, there are generally two methods of exposure to imprint the desired pattern onto the resist. The first of these exposure methods is called scanning or direct write, and it employs a beam of electrons focused to a spot, similar to focusing a beam of light, which can then be steered or scanned in a desired pattern over the surface of the resist. The other exposure method for such high-energy systems employs collimated electrons passed through a mask positioned over the surface of the resist to flood expose the resist, similar to the photolithography process discussed above, but with collimated high-energy beams projected perpendicularly onto the resist surface.

A number of publications discuss the use of such conventional exposure systems described above, including the following: "Focused Ion Beam Scans Small Structure," *Test & Measurement World*, p. 16 (1988); Darryl W. Peters, "Keeping America Competitive Examining Competitive Submicron Lithography", *Semiconductor International*, pp. 96–100 (1988); Irwin Goodwin, "Compact X-Ray Lithography Machines Generate Hope for Semiconductors," *Physics Today*, pp. 49–52 (1988); Joseph Grenier, "Wafer Fabrication Equipment Five Year Forecast," *Solid State Technology*, pp. 67–70 (1988); and William Thurber, "Photolithography's Heir Still Not Obvious, Says Interface Keynote," *Semiconductor International*, p. 15 (1988).

Electron beam (e-beam) lithography is currently considered to be the dominant high-energy radiation source for microlithography processes. The primary limitation with the e-beam lithography results from proximity effects, i.e., electron scattering and secondary electron generation in the resist and in the substrate material, which result in pattern fidelity degradation, thus inability to obtain satisfactory, sharp lines with small linewidths.

In X-ray lithography, another high-energy microlithography process, continuous Xrays are normally produced by electron bombardment of a fixed or rotating anode. Unfortunately, Such Xray sources are frequently too weak to expose commonly used single-film organic resists materials quickly, thus requiring specialized organic resists that develop faster. However, no practical, single-film organic resist presently available can be exposed rapidly enough with such Xray sources to be competitive with the projection photolithography techniques described above.

The other form of high-energy microlithography mentioned above is ion-beam lithography. Unfortunately, current ion-beam lithography techniques suffer many of the same problems as Xray lithography, including the long exposure times discussed above. Also, use of heavy ions in an ion-beam process can create additional problems due to bombardment or sputter damage. For these reasons, the application of conventional high-energy radiation exposure sources, such as ion-beam and Xray lithography, are often restricted to special uses, such as fabricating, measuring, and repairing photomasks or chip and circuit repair, as opposed to volume semiconductor chip production. The publication of T. D. Cambria and N. P. Economou, "Mask and Circuit Repair with Focused-Ion-Beams," *Solid State Technology*, Solid State Technology, pp. 133–136 (1987), explains the use of focused-ion-beam technology for mask and circuit repair.

Despite the various developments in semiconductor lithography discussed above, these processes are still in their relative infancies and continue to be plagued with the problems and disadvantages discussed above. A further problem with several of these lithography methods is that they can produce thermal and plasma instabilities in the semiconducting material of the substrate itself. Perhaps even more significant, however, are the pervasive contamination problems. First, there is physical contamination, requiring clean room facilities and special lighting requirements. Second, there is chemical contamination, usually exacerbated by organic resists and sometimes from doping (addition of impurities to a semiconductor to selectively enhance or suppress its conducting characteristics) with certain forms of ion beams.

The exposure, development, processing, and contamination problems relating to organic-based resists have motivated the microelectronic industry to look for a resistless process that would form circuit components directly in the substrate material and eliminate all the resist process steps. Generally, the major conventional energy sources existing in resistless lithography technology are high-energy Xrays, lasers, e-beams, and ion beams. However, the beams of the major high-energy sources normally are difficult to spread over large surface areas.

Several solutions to the problems associated with organic resist exposure, development, and processing are disclosed in U.S. Pat. Nos. 4,569,124; 4,601,778; 4,615,904; and 4,377,437. For example, U.S. Pat. No. 4,569,124 discloses forming thin conducting lines in a two-layered inorganic material such as silicon or aluminum, overlaying a layer of refractory metal with a high-energy, ion-beam implantation source. The two-layered material behaves as a resist. In U.S. Pat. No. 4,601,778, portions of a polysilicon film are initially exposed to either an oxygen plasma or a hydrogen plasma, and thereafter, the entire polysilicon film is exposed to a polysilicon etchant and etched without the need to employ a mask. In U.S. Pat. No. 4,615,904, a patterned film is deposited onto a substrate using a laser energy source or a low-power, focused e-beam source. Lastly, in U.S. Pat. No. 4,377,437, a high-powered ion source for implanting indium, gallium, or gold ions is used to define features directly on an inorganic layer of a solid-state precursor device, for example, $SiO_2$ or $Si_3N_4$, which serves as a mask.

In a development involving gallium-ion implantation, the article by P. H. La Marche and R. Levi-Setti, "Amorphous Silicon as an Inorganic Resist," in *SPIE* Vol. 471, *Electron-Beam, X-Ray and Ion-Beam Techniques for Semimicrometer Lithographies III*, pp. 60–65 (1984), discloses that negative tone images can be produced in glow-discharge-deposited amorphous silicon hydride by selective gallium-ion implantations. Also, the gallium-implanted amorphous silicon exhibits a greatly reduced etch rate.

The parent patent application of the present invention, titled Hydrogen Ion Microlithography, as identified in the opening paragraph of this application, represents a solution to many of those problems enumerated above. It also includes a process of depositing an oxide layer on the surface of the amorphous silicon, then sputtering away or otherwise removing patterned portions of the surface oxide layer, and finally removing the remaining underlaying amorphous silicon in those patterned portions, such as with hydrogen plasma etching, to finish the resist development. However, that hydrogen ion microlithography method still has the disadvantage of limited throughput and yield due to the lengthy exposure times required. Additionally, that hydrogen ion process, as most microlithography processes, does not lend itself easily to clean, fast, or simple dry etching processes, which are preferred by the microelectronics industry.

SUMMARY OF THE INVENTION

Accordingly, pursuant to the foregoing background, it is a general object of the present invention to provide a simple, economic, and efficient ion-beam microlithography process for resist and chip development that realizes a higher throughput and greater yield.

It is another object of the present invention to provide a microlithography process with increased resolution and which therefore allows for finer linewidth patterns.

It is still another object of the present invention to provide a microlithography process that is cleaner and more contamination free, contributing to the increased precision necessary at higher resolutions and an overall cost reduction by reducing or removing requirements for clean room facilities and needs for special lighting.

It is yet another object of the present invention to reduce the potential of chemical contamination commonly associated with dopant material bombardment and organic resists.

It is also a specific object of the present invention to provide an ion-beam microlithography process that employs a resist and an ion exposure that easily lends itself to a clean, fast, and simple dry etching process, which is preferred by the microelectronic chip industry.

It is still another specific object of the present invention to provide an ion-beam microlithography process that employs a resist and an ion exposure wherein the thermal and plasma stability of the resist remain excellent throughout the process.

It is yet another specific object of the present invention to provide an ion-beam microlithography process that lends itself to collimated and masked pattern exposure, as well as to a focused, scanned point, exposure, to generate a pattern.

It is still and yet another specific object of the present invention to provide an ion-beam microlithography process that employs a resist and an ion exposure that provides residual exposed material, following negative resist pattern development, that may be retained as an insulator to be incorporated into the subsequent integrated circuit chip development.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the process of this invention may include the steps of providing a single, thin-film, inorganic resist material on a semiconducting substrate. This inorganic resist can be either an amorphous silicon or a hydrogenated amorphous silicon material. A pattern is recorded in the amorphous silicon resist material by selectively oxidizing portions of the material. This selective oxidation is accomplished by a low-energy oxygen ion-beam source, either in the form of a focused, scanning oxygen ion-beam direct write procedure, or by a collimated and masked oxygen ion-beam. Finally, this recorded pattern is developed, preferably by dry etching with a hydrogen plasma, to provide a suitable surface pattern, which is adaptable for subsequent use in the microelectronics industry for integrated circuit chip development and semiconductor device processing.

BRIEF DESCRIPTION OF THE DRAWINGS

The accompanying drawings, which are incorporated herein and form a part of the specification, illustrate preferred embodiments of the present invention, and together with the description, serve to explain the principles of the invention. In the drawings.

DESCRIPTION OF THE PREFERRED EMBODIMENT

Figure 1:
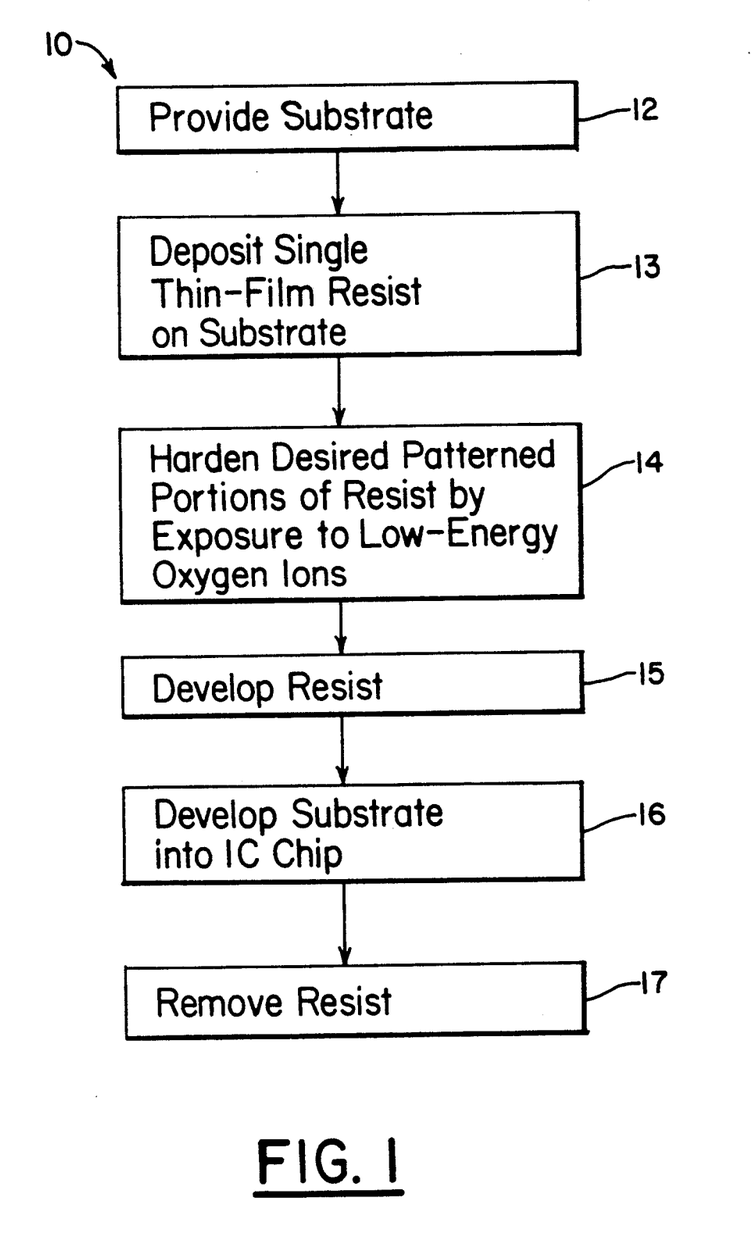
FIG. 1 is a generalized block diagram or schematic indicating the steps in the process of the preferred embodiment of the present invention.

The low-energy oxygen ion-beam microlithography process 10 of the present invention, as illustrated in FIG. 1, is used to provide and develop a patterned resist on the surface of a substrate material, such as Si, GaAs, or the like, that is to be processed into a semiconductor integrated circuit chip, or the like. Providing a substrate, which is usually a semiconductor material upon which the desired end product integrated circuit (IC) chip will be made, is the first step 12 of this process 10. A single thin film layer comprising amorphous silicon or hydrogenated amorphous silicon is then deposited in step 13 on the surface of the substrate to form the basis for the resist. Selected portions or patterns of the layer comprising amorphous silicon are then hardened in step 14 by exposure to an oxygen ion beam, thereby oxidizing the exposed portions of the amorphous silicon. The oxidized portions of the resist, according to this invention, are extremely resistant to dry etching with a hydrogen plasma. Therefore, the resist material is developed in step 15 with hydrogen plasma, which quickly etches away the unoxidized portions of the layer comprising amorphous silicon and leaves the oxidized portions of the resist intact. With the desired pattern etched through the resist, the next step 16 is to develop the substrate into an integrated circuit (IC) chip in a normal manner by exposing the portions of the chip not covered by the remaining portions of the resist to dopants, chemicals, or other materials that become components of the IC. Finally, after the IC is developed, the remaining portions of the resist can be removed in step 17, or, if desired, they can be left to serve as insulating components or areas of the IC.

With the above outline of the steps of the process of this invention in mind, a more detailed description of the preferred embodiment is provided with reference to both the function block diagram in FIG. 1 and the structural illustrations in FIGS. 2-5. The substrate material provided in step 12 of FIG. 1 is shown in more detail as substrate 22 in FIG. 2. To produce an IC chip, the substrate 22, which is preferably a semiconductor material, has to be selectively treated with doping material, such as N-type dopant or P-type dopant, at specific locations and in specific designs or patterns to produce the transistors and other electronic components and circuits in the substrate that will comprise the finished IC. The substrate 22 also has to have conductive material, such as metals or nonmetallic ohmic materials, deposited thereon to form the required electrical connections between the circuit components in the IC. Such materials are usually etched into, deposited on, or incorporated into the semiconducting substrate 22 in some manner. The resist developed on the substrate 22, according to this invention, of course, facilitates chip treatment, as will be described in more detail below.

Figure 2:
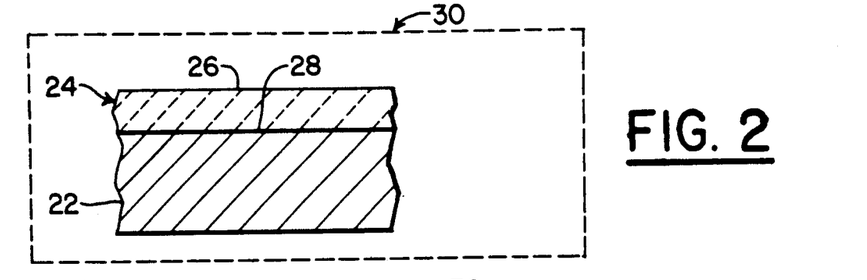
FIG. 2 is an enlarged cross-sectional elevation view of the developing chip of the preferred embodiment of the present invention showing an inorganic resist deposited upon a semiconducting substrate.

The composition of substrate 22 can be varied, depending on the application and ultimate use of the desired chip following its processing and development. For example, substrate 22 could be a metal, a glass, or a plastic material. However, in integrated circuit manufacturing applications, substrate 22 is usually preferred to comprise a single crystal semiconductor material, such as Si or GaAs, with or without an oxide layer. Substrate 22 in FIG. 2 is described as a single crystal intrinsic silicon, but it should be understood that this designation is only for the purpose of example and not for limitation. For large area chips, display circuits, or manufacturing applications, substrate 22 may comprise a semiconductive or conductive thin film, which is itself deposited on a support or substrate.

It is common practice in the industry to deposit a multiple-layer resist on the substrate surface. In the preferred embodiment of the present invention, however, a single thin film 24 comprising an amorphous silicon material (a-Si) or a hydrogenated amorphous silicon (a-Si:H) material is deposited on the substrate 22 to form the basis for the resist. The oxidation and hydrogen plasma etching steps of this invention, which are described in more detail below, are not strongly dependent on the hydrogen content of the amorphous silicon 24. For convenience, the resist material 24 used in this invention will be referred to as amorphous silicon or a-Si, although, as mentioned above, hydrogenated amorphous silicon (a-Si:H) can also be used. Therefore, the designation of amorphous silicon or a-Si for purposes of this invention will be considered to include hydrogenated amorphous silicon (a-Si:H) as an equivalent. This deposition of the thin film layer 24 comprising amorphous silicon on the substrate 22 can be accomplished by any of several methods commonly known in the industry, such as sputtering, photochemical vapor deposition, physical vapor deposition, homogeneous chemical vapor deposition (CVD), or light-induced CVD using infrared lasers.

There are several advantages in using an amorphous silicon or its hydrogenated form as a resist material 24. First, it reacts with oxygen to form an oxide that is inert and highly resistant to radiofrequency-excited (RF) hydrogen plasma etching, according to this invention as described above. Second, the amorphous silicon can be evaporated over a very large area of almost any surface configuration of almost any substrate 22, with no requirement that the substrate 22 be especially flat, as is commonly required in conventional photolithographic resist development processes. Third, amorphous silicon exhibits excellent thermal and plasma stability during resist development. A fourth advantage is that only one deposition has to be performed, as opposed to multiple depositions commonly required for multiple-layer resists, making this process less complex, less costly, and less time consuming. Additionally, the ability to make the resist 24 a single thin film instead of thicker multiple layers allows for better reproducability and better resolution of the resulting surface network pattern. A fifth advantage of the present invention is that this amorphous silicon resist 24 is inorganic, which further minimizes, if not virtually eliminates, the possibility of contaminating the substrate, which is always a concern when organic materials have to be used.

Figure 3:
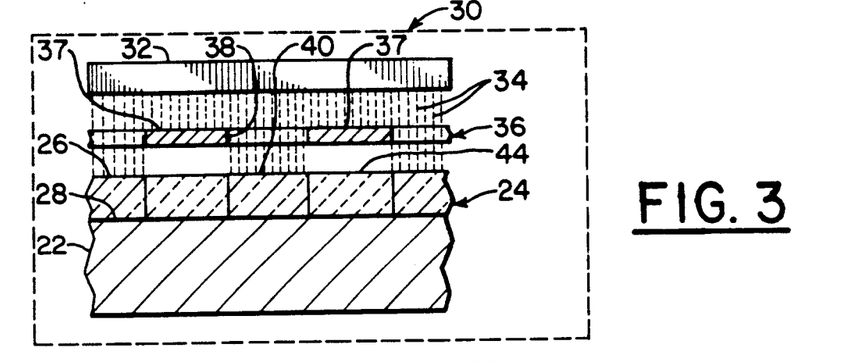
FIG. 3 is an enlarged cross-sectional elevation view of the developing chip of the preferred embodiment of the present invention showing collimated and masked oxygen ion-beam exposure of the same.

The next step 14 of the process 10 of the present invention is to "harden" or make selected portions or regions of the a-Si resist material 24 resistant to the etchant material to be used in subsequent processing steps. The terms harden or hardening, as used herein, therefore, means to process the a-Si resist 24 to make selected portions of it resistant to penetration and removal by the etchant. The selected portions of the a-Si resist 24 are hardened according to this invention by the exposure of the selected portions or regions 40 to low-energy oxygen ion beams 34, as illustrated in FIG. 3. This selective exposure of the a-Si resist material 24 to oxygen ions 34 leaves those selected regions 40 of the resist 24 oxidized, and those oxidized regions 40 are intermingled with other regions 44 of the resist 24 that have not been oxidized. The resulting desired pattern of selected oxidized regions 40 interspersed with unoxidized regions 44 of the resist 24 allow one to exploit the chemical and physical differences inherent in the oxidized versus unoxidized regions of the resist material 24. For example, by selectively removing either the oxidized 40 or the unoxidized 44 portions, channels or openings through the resist 24 to the substrate 22 are created, as will be described in more detail below. The resulting channels or openings 56 through the resist 24, shown in FIG. 5, allow passage of the dopants or other materials to the substrate 22 as necessary for chip development.

One method of recording or creating a desired pattern of oxidized and unoxidized regions on the amorphous silicon resist material 24, according to step 13 of this invention, is to expose selected parts of the resist material 24 to oxygen ion beams 34 through a mask 36, as illustrated in FIG. 3. If the resist layer 24 is too thick, a pattern that is clear and definite at the exposed surface 26 adjacent the mask 36 may not result in as clear or as definite a pattern at interface 28 between resist 24 and substrate 22 because of angular and lateral reactions in the resist 24 with the oxygen ion beams 34. Therefore, because the important part of the pattern to be recorded into resist 24 is that part of the pattern that results at the interface 28 between resist 24 and substrate 22, the best pattern resolution is obtained when the resist film 24 thickness is a fraction of the desired horizontal linewidth of the resulting pattern. Accordingly, for very fine line patterns of micrometer dimensions, a film 24 thickness of less than 1 $\mu$m is preferred, and a thickness in the range of only about 500 nm is even more preferable.

With continuing reference primarily to FIG. 3, the patterned mask 36 is positioned over the a-Si film 24. The mask 36 is preferably made from a metal sheet and has a plurality of cutouts or apertures 38 interspersed in the selected pattern between solid blocked portions 37. A collimated oxygen ion source 32 is positioned over the mask 36 for generating collimated, parallel oxygen ion beams 34 over the broad area of the mask 36. Those collimated oxygen ion-beams 34 pass through the openings 38 in mask 36 and are incident perpendicularly on the amorphous silicon 24, thereby forming oxidized layers 40 on the amorphous silicon 24 in patterns corresponding to the cutouts or apertures 38 in the mask 36. The masked areas 44 of the resist surface 26, of course, are not exposed to the ion beams 38, so the a-Si resist materials in those areas 44 under the blocked areas 38 of mask 36 remain unoxidized and unchanged. Therefore, the oxidized regions 40 of the amorphous silicon resist 24, as mentioned above, are chemically different from the unoxidized portions or regions 44 and, in particular, are virtually impervious to hydrogen plasma etching.

In FIG. 3, selectively oxidized regions 40 are shown as extending uniformly from surface 26 of the resist material 24 down to interface 28 between the resist material 24 and the substrate 22. The actual depth of the selectively oxidized regions 40 can vary, depending on the thickness of the original resist material 24, on the energy of the oxygen ion beam 24, and on the length of exposure time to the oxygen ion beams 34. However, as mentioned above, one of the principal advantages of the present invention is the speed and ease with which this resist 24 can be developed. Even with only a slight surface oxidation of no more than 5-nm thick, this selectively oxidized region 40 becomes highly resistant to etching, particularly to RF-excited hydrogen plasma etching, as will be discussed below. In the IC industry, oxygenization of silicon is usually achieved by heating the silicon to above 700° C. in oxygen or water vapor. However, it has been found during the development of this invention, that simply leaving a piece of a-Si:H film in air at room temperature for about four hours is enough for it to develop sufficient thickness (about 2.5 nm) of native oxide on the surface to resist etching by hydrogen plasma. Using oxygen ion beams, even the low-energy oxygen ion beams 34 in a vacuum chamber 30, according to this invention, even in normal room temperatures, results in even much faster oxide layer formation. Accordingly, lengthy exposure times to the oxygen ion beams 34 are not required, which further speeds up the process and increases throughput and yield. Due to the bonding configurations within the amorphous silicon and the diffusion effects associated with the collimated oxygen ions 34, even with lengthy exposure times, the accumulation of oxygen and resulting formation of silicon dioxide ($SiO_2$) at surface 26 will be substantially more than that forming closer to the interface 28.

It is also significant that mask 36, when used as described in this invention, is not degraded and does not have to be in contact with the resist 24. Therefore, it can be used again for subsequent chip preparation, thereby ensuring the repetitive uniformity necessary for large-scale chip production.

Figure 4:
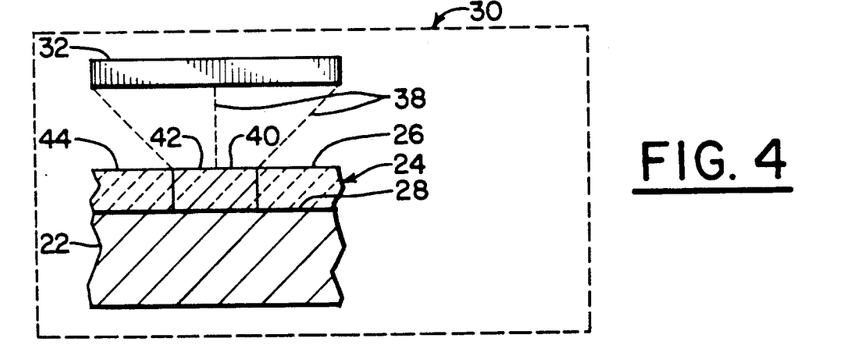
FIG. 4 is an enlarged cross-sectional elevation view of the developing chip of an alternative embodiment of the present invention showing a scanning oxygen ion-beam exposure of the same.

As an alternative to masking portions of the resist material 24 and flooding the exposed surfaces of the mask 36 and resist material 24 with the collimated oxygen ion beams 34, as described above, a single oxygen ion beam 38 from a source 32, as illustrated in FIG. 4, can be focused to a spot, or, more accurately, to an area 42 of narrow width on the surface 26 of the resist material 24 and scanned in a predetermined pattern and at a predetermined rate over the resist surface 26. Apparatus and techniques for focusing and scanning an ion beam in this manner are known in the industry to persons skilled in the art, so they are not described in detail here. Such techniques are commonly referred to in the industry as the direct write or scanning techniques and are similar to focusing and scanning a laser beam.

An ion beam 38, when focused on a selected spot or area 42 on the resist surface 26, as illustrated in FIG. 4, effectively exposes that spot or area 42 on surface 26 of resist 24 to atomic oxygen, thereby forming the selectively oxidized region 40 without a mask. Again, in FIG. 4, selectively oxidized region 40 is shown as extending uniformly from surface 26 down to interface 28 between it and substrate 22. However, such saturating exposure is not required, as discussed above for the embodiment in FIG. 3. In this scanning ion beam procedure in FIG. 4, the desired pattern is developed on resist 24 by selectively focusing the ion beam 38 and scanning the desired lines or areas of exposure 42. For precision and repeatability, the precise points or areas of focus 42 and lines to be scanned can be programmed into a microprocessor unit or computer connected to, controlling, and steering ion beam source 32 in a manner that is well known, and thus not shown in the drawings or described herein.

An advantage of the focused scanning ion beam of this FIG. 4 embodiment is the potential for achieving very fine linewidths on the order of nanometers. The collimated and masked ion beam procedure of the FIG. 3 embodiment, on the other hand, has the advantage of being more useful in the fabrication of very large area circuits, such as, for example, those having areas of several square feet or even square meters.

Having selectively exposed those certain desired areas 40 of the amorphous silicon thin-film resist 24 to oxygen ion bombardment, these certain areas 40 are chemically and structurally changed by the absorption of the oxygen, effectively becoming oxidized or changed to $SiO_2$. These exposed regions 40 interspersed between and among unexposed regions 44 form the selected pattern or network within thin film 24.

The chemical and structural differences between the exposed and unexposed regions, or in this case the oxidized and unoxidized regions 40, 44, respectively, provide selective resistance to removal of one or the other of these regions under various wet or dry etching processes. Developers that remove the exposed or oxidized regions 40 of resist 24, while allowing the nonexposed regions 44 to remain, cause resist 24 to be what would be called a positive resist. Conversely, those developers or developing techniques that remove the nonexposed regions 44, while leaving the exposed regions 40 intact, cause resist 24 to be what would be called a negative resist. Wet etching is usually accomplished by application of some chemical solution to the surface of the resist, which corrodes or otherwise facilitates removal of one of the regions, either the exposed or the unexposed. However, wet etching is not the preferred method in the industry due to possible chemical contamination and physical damage associated with it.

Figure 5:
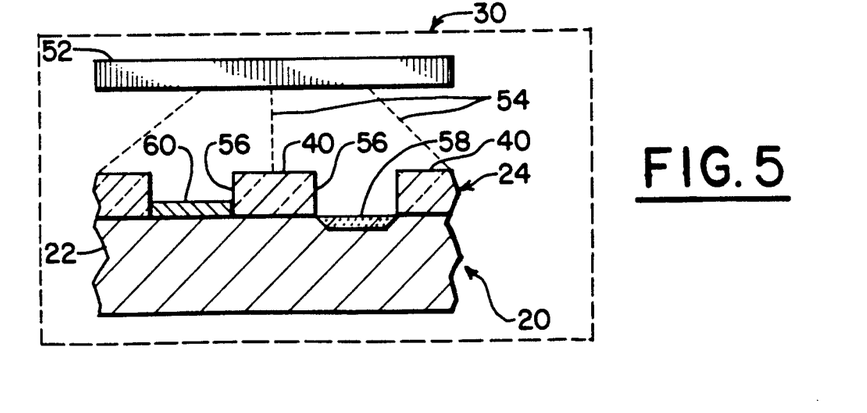
FIG. 5 is an enlarged cross-sectional elevation view of the developing chip of the preferred embodiment of the present invention showing the results of negative development by dry etching and subsequent thereto, chip construction on the semiconducting substrate.

Accordingly, the preferred method of finishing the development of the resist 24 in step 15, according to this invention, is with a dry development or etching technique, illustrated in FIG. 5. This dry etching may be accomplished by exposure of the patterned resist 24 from either FIG. 3 or FIG. 4 to an etch gas 54, which, for example, may be an RF-excited hydrogen plasma generated by an RF-powered electrode 52. Although this RF-excited hydrogen plasma is very effective in etching and removal of the unexposed regions 44 from the resist 24, as already described above, even a few nanometers of oxide present on the surface of the oxidized or exposed regions 40 make those exposed regions 40 extremely resistant to the hydrogen plasma etching. For example, some samples of amorphous silicon having only a minimal oxygen exposure were etched with RF-excited hydrogen plasma for as long as 16 hours without having any significant material loss; whereas, the same RF-excited hydrogen plasma can etch the unexposed regions 44 of the amorphous silicon resist material at a rate of about 2 nm/min. These results have been obtained in a system where the hydrogen plasma was maintained in a vacuum with a hydrogen flow rate of 30 sccm, a reactor chamber hydrogen pressure of 4 torr, and a RF power density of 0.07 W/cm$^2$. Because of the relatively short exposure time necessary to sufficiently oxidize the regions 40, as described above, the fast etch rates of the unexposed regions 44 by the RF-excited hydrogen plasma, and the fact that both the oxidation step and the hydrogen plasma etching step can be done in a vacuum system, the oxygen ion-beam lithography process, according to the present invention, can have a very high throughput and yield.

The etching and removal of the unoxidized regions 44 by RF-excited hydrogen plasma, as described above, results in a patterned series of openings or channels 56 through resist 24, as illustrated in FIG. 5. Accordingly, the pattern imparted into resist 24 by oxidation to alter its chemical and physical characteristics can be reduced to a physical pattern on the surface of substrate 22 in the form of a network of channels 56 by RF-excited hydrogen plasma etching.

Subsequent to the resist development process described above, the substrate 22 may be developed or constructed for an integrated circuit chip 20 or other use, as is well known in the art. For example, in the construction of an integrated circuit chip 20, as show in FIG. 5, some dopant material, such as boron, gallium, or indium for forming a P-type material, or phosphorous or arsenic for forming an N-type material 58, may be incorporated into substrate 22. Also, other materials 60, such as conductive metals, ohmic contact materials, and the like can be deposited within channels 56 to complete other structures of the integrated circuit in a conventional manner.

Following the substrate development, the residual portions 40 of resist 24 that were not removed in the RF hydrogen plasma etching process can either be removed or retained. Removal may be necessary or desirable where the silicon dioxide portions 40 are unnecessary or unwanted elements of the active semiconductor chip 20. Such removal can be done by mechanical abrasion or scratching, sputtering, wet or dry chemical etching, or a combination of these or other procedures that are normally used to remove silicon dioxides in the semiconductor chip industry. However, SiO$_2$ is an inert dielectric material that is very compatible with semiconductor and IC materials. Therefore, in those instances where the insulating or protective characteristics of silicon dioxide can be incorporated into the design of the active semiconductor chip 20, or where the silicon dioxide can serve as a base for another layer of semiconducting material in a multilayer semiconducting chip, it may be preferred that those exposed or oxidized regions 40 of SiO$_2$ be retained.

It is preferred that at least steps 13-15 of FIG. 1, i.e., the deposition of the resist through its development, if not all of steps 12-17, be conducted in a vacuum environment. Such a vacuum environment may be a vacuum chamber, or, preferably, a series of vacuum chambers connected by vacuum interlocks, i.e., an in-line vacuum production system (not shown in detail but represented in FIGS. 2-5 by broken lines 30). Preforming these steps in vacuum chambers 30 reduces the potential for contamination of the resulting IC chips 20, improves the yield, and enhances reproducability. As IC chips get smaller, the finer linewidth patterns required have necessitated avoidance of contamination. Contaminant particle sizes, which years ago would have been too small to cause any problems, can today cause overlapping, thereby producing electrical shorts, between several lines of a given network pattern on today's submicrominiature chip sizes, thus rendering the chip ineffective and useless. The use of a vacuum chamber, and particularly an in-line vacuum system 30, also greatly reduces the cost of IC chip production with the process of this invention by further reducing or removing the requirement for clean room facilitates and special lighting requirements, such as are now commonly required in the IC chip manufacturing industry.

Clean room facilities in contempory IC chip manufacturing processes are only needed to keep particles in the atmosphere from coming into contact with and thereby contaminating, the IC chips as they are being developed. Conventional batch processing in contemporary and prior art technologies requires the developing IC chips to be exposed to the environment as they are moved from one batch process step to another, thus requiring such expensive clean room environments to substantially eliminate such particulates from the air. With the oxygen ion-beam microlithography process of this invention however, which can be done entirely in an in-line vacuum system 30 without exposure to the environment, the IC chips can be isolated from the environment throughout all the critical stages of development. Therefore, such extravagent clean room facilities needed to remove particulates from the air are not required.

Some prior art IC chip development processes, as mentioned in the background section above, use resist materials that are developed by selective patterned exposure to special light, such as ultraviolet light that changes the chemical or physical nature of the exposed portions of the resist materials. Such processes, therefore, have to be done in environments devoid of extraneous or background ultraviolet light to keep from exposing the resist material or portions thereof to unwanted ultraviolet light from the environment during critical stages of the resist pattern development. Therefore the rooms where such prior art processes are performed have to be equipped with expensive, special lighting, which produces only light in the longer wavelengths, such as red, to eliminate the possibility of unwanted exposure of the developing resist materials to ultraviolet light. Because ion beams, rather than ultraviolet or other special light, are used in the process of the present invention, however such special environmental lighting is not required.

Also, the ability to perform the entire lithography process of this invention (resist deposition, exposure to oxygen ion beams, and hydrogen plasma etching) in an in-line vacuum system makes this process especially conducive to full automation under computer control. Such full automation will further improve the throughput and yield of the lithography process of this invention.

The oxygen ion-beam source 32 may be any ion-beam source suitable for providing a low implantation energy of from about 300 to about 1000 eV and a current density of about 0.1 mA/cm$^2$ to about 20 mA/cm$^2$. High-energy ion beams are not needed in the process of this invention, because, as mentioned above, oxidation is a spontaneous chemical reaction between oxygen and silicon. Therefore, this process is not an ion-beam sputtering or ion-implantation process, which would require higher energy ion beams. The Kaufman Ion Beam System marketed by Commonwealth Scientific Corp. under the trademark Miliatron IV is an example of such a commercially available ion source. The specific structural details of the Kaufman Ion Beam System have not been included in the drawings, because the system is well known in the industry.

It is also appropriate to mention that, while the preferred ion species for the process of this invention is oxygen, it can also be performed with other ion species, such as nitrogen or carbon. For example, the a-Si layer 24, such as that shown in FIG. 2, can be exposed to low-energy nitrogen ion beams or low-energy carbon ion beams, either through the mask 36 of FIG. 3 or focused to an area 42, as illustrated in FIG. 4. When nitrogen ion beams are used, the exposed portions 40 of the a-Si resist material 24 will become silicon nitride ($Si_3N_4$), and when carbon ion beams are used, they will become silicon carbide (SiC). Therefore, while nitrogen and carbon ion beams and the resulting $Si_3N_4$ and SiC resist materials have not undergone as extensive development and testing in the process of this invention as have oxygen ions and the resulting $SiO_2$, they will work and are considered to be equivalents for the purposes of this invention.

The foregoing is considered as illustrative only of the principles of the invention. Further, because numerous modifications and changes will readily be apparent to those skilled in the art, it is not desired to limit the invention to the exact construction and operation shown and described, and accordingly, all suitable modifications and equivalents may be resorted to falling within the scope of the invention as defined by the claims which follow.

The embodiments of the invention in which an exclusive property or privilege is claimed are defined as follows:

1. A method of providing and developing a resist on a substrate, comprising the steps of:
   depositing a thin film of amorphous silicon on the substrate;
   exposing selected portions of the amorphous silicon thin film to oxygen ions to oxidize the amorphous silicon at those selected portions; and
   removing the portions of the amorphous silicon that were not oxidized.

2. The method of claim 1, including the step of removing the portions of the amorphous silicon that were not oxidized by exposing the amorphous silicon film to RF-excited hydrogen plasma.

3. The method of claim 1, including the step of exposing selected portions of the amorphous silicon thin film to oxygen ions by masking the unselected portions of the amorphous silicon thin film to prevent those unselected portions from being exposed to oxygen ions, and directing a broad ion beam over the surfaces of the mask and the selected unmasked portions of the amorphous silicon film.

4. The method of claim 1, including the step of exposing selected portions of the amorphous silicon thin film to oxygen ions by focusing an oxygen ion beam to a desired incident width on the amorphous silicon film and scanning the focused beam in a desired pattern over the amorphous silicon film.

5. An ion-beam lithography process useful in fabricating a microelectronic chip or semiconductor device on or in a substrate comprising the steps of:
   depositing a layer of resist material comprising amorphous silicon on the substrate;
   recording a pattern in said resist material layer by oxidizing selected portions of said layer; and
   developing the selectively oxidized pattern to provide a surface pattern that is adaptable for subsequent use in fabricating the semiconductor device.

6. The process of claim 5, wherein said layer of resist material is a hydrogenated amorphous silicon.

7. The process of claim 5, wherein said layer of resist material comprises a single thin-film layer.

8. The process of claim 7, wherein said single thin-film layer is less than 600 mm.

9. The process of claim 5, including the step of selectively oxidizing the resist material layer by focusing an oxygen ion beam on said layer of resist material and scanning the oxygen ion beam over selected areas of the resist.

10. The process of claim 5, including the step of selectively oxidizing the resist material layer by covering portions of the resist that are not selected to be oxidized with a mask and exposing the selected uncovered portions to a broad collimated oxygen ion beam.

11. The process of claim 5, including the step of developing said selectively oxidized layer by removing those regions substantially free of oxidation while retaining the oxidated regions of said selectively oxidized material.

12. The process of claim 11, including the step of removing the oxidation-free regions while retaining the oxidated regions by exposing the resist to a Radio-Frequency-Excited hydrogen plasma.

13. The process of claim 5, including the steps of depositing a layer of resist material recording a pattern by selective oxidation, and developing said pattern in a vacuum.

14. The process of claim 5, including the step of recording a pattern in said layer with pattern linewidths of less than 1 μm.

15. A high-resolution lithography process for making microelectronic devices, comprising the steps of:
   providing a substrate in a vacuum;
   depositing onto said substrate a single thin-film layer of resist material comprising amorphous silicon while the substrate is in said vacuum;
   exposing selected portions of said resist material to an oxygen ion beam while said substrate is in said vacuum to produce a high-resolution pattern of oxygen-exposed regions interspersed between non oxygen-exposed regions to form a negative resist;

developing said negative resist by a dry etching process.

16. The process of claim 15, including the step of providing an intrinsic silicon substrate.

17. The process of claim 16, including the step of depositing the single thin-film layer of resist material of a hydrogenated amorphous silicon.

18. A method of providing and developing a resist on a substrate, comprising the steps of:

depositing a thin film of amorphous silicon on the substrate;

exposing selected portions of the amorphous silicon thin film to ion beams selected from the group of ion species consisting of oxygen, nitrogen, and carbon ions; and selectively removing either the portions of the amorphous silicon film that were not exposed to the ion beams or the portions of the amorphous silicon film that were exposed to the ion beams.

19. The method of claim 18, including the step of removing the portions of the amorphous silicon film that were not exposed to the ion beams by etching with RF-excited hydrogen plasma.

* * * * *